United States Patent [19]

Park

[11] Patent Number: 5,493,260

[45] Date of Patent: Feb. 20, 1996

[54] THREE-TERMINAL NOISE FILTER HAVING M-SHAPED LEAD

[75] Inventor: Jong M. Park, Suwon, Rep. of Korea

[73] Assignee: Samsung Electro-Mechanics Co. Ltd., Suwon, Rep. of Korea

[21] Appl. No.: 138,845

[22] Filed: Oct. 19, 1993

[30] Foreign Application Priority Data

Oct. 23, 1992 [KR] Rep. of Korea .................. 92-20515

[51] Int. Cl.⁶ .................................................. H03H 7/09
[52] U.S. Cl. .......................... 333/185; 29/25.42; 29/600; 29/602.1
[58] Field of Search ......................... 333/181, 185, 333/12; 29/25.42, 602.1, 604, 600

[56] References Cited

U.S. PATENT DOCUMENTS

| | | | |
|---|---|---|---|
| 4,752,752 | 6/1988 | Okubo | 333/185 X |
| 4,777,460 | 10/1988 | Okubo | 333/185 X |
| 4,782,311 | 11/1988 | Ookubo | 333/185 X |
| 4,823,103 | 4/1989 | Nakagawa et al. | 333/12 X |
| 4,847,730 | 7/1989 | Konno et al. | 333/181 X |
| 4,908,586 | 3/1990 | Kling et al. | 333/185 X |
| 5,015,975 | 5/1991 | Okubo | 333/185 X |

FOREIGN PATENT DOCUMENTS

| | | | |
|---|---|---|---|
| 160718 | 8/1985 | Japan | 333/185 |
| 0056010 | 3/1988 | Japan | 333/185 |

*Primary Examiner*—Benny Lee
*Attorney, Agent, or Firm*—Webb Ziesenheim Bruening Logsdon Orkin & Hanson

[57] ABSTRACT

The invention discloses a 3-terminal noise filter for preventing electro-magnetic interferences, and a process for manufacturing thereof. A lead wire is bent into an M shaped structure, with a depressed portion being formed on the upper portion of the M shape structure. A separate lead is disposed as a capacitor lead, and the bottom of the depressed portion and the leading end of the capacitor lead are pressed into first and second flat portions. Then a capacitor is soldered on the first and second flat portions. The man-hours for the manufacturing of the filter are reduced, and the mechanical and electrical characteristics are stabilized, and the manufacturing cost is saved by the use of low cost materials.

4 Claims, 6 Drawing Sheets

THREE-TERMINAL NOISE FILTER HAVING M-SHAPED LEAD

FIELD OF THE INVENTION

The present invention relates to a 3-terminal noise filter and a process for manufacture thereof, in which electromagnetic interferences between electronic apparatuses are prevented.

BACKGROUND OF THE INVENTION

Generally during the operations of electronic apparatuses, there exist various power source noises and clock pulse source noises. Such noises are propagated through circuit power lines or signal lines across circuits, with the result that malfunctions of the electronic apparatus are liable to occur.

Further, the power source noises and the clock pulse noises which are generated from the interior of an electronic apparatus can propagate to other electronic apparatuses through the power lines to cause malfunctions in the other electronic apparatuses. In the same way, noises can be introduced from another electronic apparatus to cause a malfunction. In generic terms, these are called electromagnetic interferences.

In order to prevent such electro-magnetic interferences, noise filters are disposed between circuits and a circuit power source, and between circuits and a clock pulse source. Such a noise filter forms a 3-terminal LC filter and includes two inductors and one capacitor.

FIG. 1 is an equivalent circuit for a 3-terminal LC noise filter.

Referring to FIG. 1, The noise signal component which is inputted through terminals 10 and 11 is bypassed to the ground by a first LC filter which consists of a first inductor L1 and a capacitor C1. Meanwhile, the noise signal component which is inputted through terminal 12 and terminal 11 is bypassed to the ground by a second LC filter which consists of a second inductor L2 and the capacitor C1.

The first and second inductors L1 and L2 are designed in such a manner that they should have the same inductance value, and therefore, the first and second LC filters have the same filtering characteristics.

FIG. 2 is a perspective view showing the structure of a conventional 3-terminal noise filter.

Referring to this drawing, a long lead wire 13 is bent twice rectangularly, and first and second inductor leads 14 and 15 corresponding to terminals 10 and 12 of the equivalent circuit of FIG. 1 are formed. Cylindrical ferrite beads 19 and 20 are fitted respectively to the first and second inductor leads 14 and 15 up to the bent portions.

Then a first electrode 22 of a chip capacitor 21 is soldered to the middle portion of an upper bar 16 which connects the first and second inductor leads 14 and 15 to each other. Then a second electrode 23 of the chip capacitor 21 is soldered to a capacitor lead 17 which is disposed between the first and second inductor leads 14 and 15 in parallel with the first and second inductor leads 14 and 15, thereby completing the final structure of the 3-terminal LC noise filter.

Here, a head portion 18 of the capacitor lead 17 which is connected to the second electrode 23 of the chip capacitor 21 is shaped like the head of a nail to increase the contact area.

However, in such a conventional 3-terminal noise filter as described above, when the chip capacitor 21 is soldered between the center of the upper portion 16 and the capacitor lead 17, much time is consumed and care has to be exercised for the position setting of the chip capacitor 21. Consequently, work efficiency and productivity are lowered, as well as producing large amounts of soldering defects.

Particularly, when the 3-terminal noise filter is used for radio frequency operation, there exists a length difference l between the capacitor lead 17 and the first and second inductor leads 14 and 15. When such a 3-terminal noise filter is positioned on a circuit board, the filtering characteristics are varied due to the inductance component of the length difference 1.

FIG. 3 illustrates another conventional 3-terminal noise filter.

Referring to FIG. 3, there is used a lead frame plate instead of the wire of FIG. 2. First a metal plate is cut rectangularly to form a lead frame 26 having first and second inductor leads 24 and 25. Then the first and second inductor leads 24 and 25 are inserted into first and second ferrite beads 19 and 20. Then first and second electrodes 22 and 23 of the chip capacitor 21 are soldered between a capacitor lead 27 (shaped like the lead frame) and the center of an upper portion which connects the first and second inductor leads 24 and 25, thereby completing the final structure of the 3-terminal noise filter.

This structure has advantages in ease of soldering and improvement of yield, but the lead frame is very expensive, with the result that the manufacturing cost is increased.

SUMMARY OF THE INVENTION

The present invention is intended to overcome the above described disadvantages of the conventional techniques.

Therefore it is the object of the present invention to provide a 3-terminal noise filter and a process for manufacture thereof, in which the structural stability of the noise filter is assured, the assembling man-hours are reduced, and the manufacturing cost is lowered.

In achieving the above object, the process of the present invention includes the steps of:

bending a lead wire into an M shape to form first and second inductor leads having a depressed portion between them;

inserting the first and second inductor leads into first and second cylindrical ferrite beads, positioning another lead wire with a certain gap from the depressed portion between the first and second inductors, the lead wire becoming the lead for a capacitor, and securing the lower ends of the respective leads on a base paper by means a piece of tape;

forming first and second flat portions by pressing the leading end of the capacitor lead and the bottom of the depressed portion, and forming irregular portions on the first and second inductor leads to fit first and second ferrite beads;

spreading solder paste on the first and second flat portions, and putting a chip capacitor on the first and second flat portions and subjecting it to curing; and securing first and second ferrite beads on the irregular portions of the first and second inductor leads in a close contact, and molding an insulating resin on the surface of the structure, thereby completing the formation of the 3-terminal noise filter according to the present invention. The present invention provides also a 3-terminal noise filter manufactured based on the above described process.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
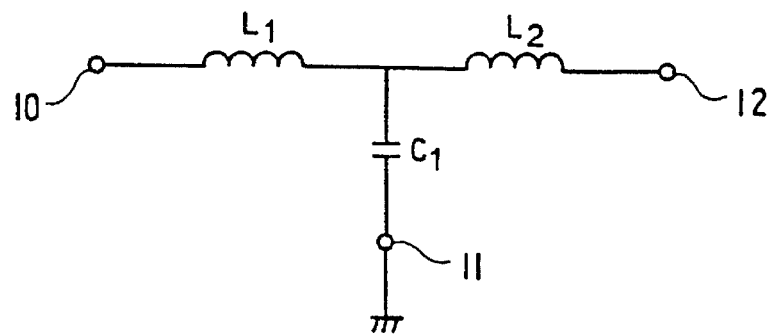
FIG. 1 is a circuit diagram for the 3-terminal noise filter.
Figure 2:
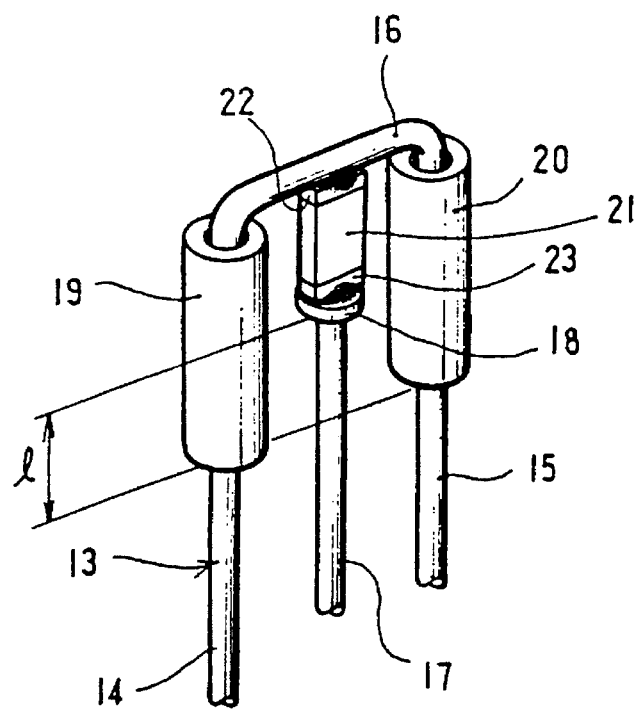
FIG. 2 illustrates the structure of a conventional 3-terminal noise filter.
Figure 3:
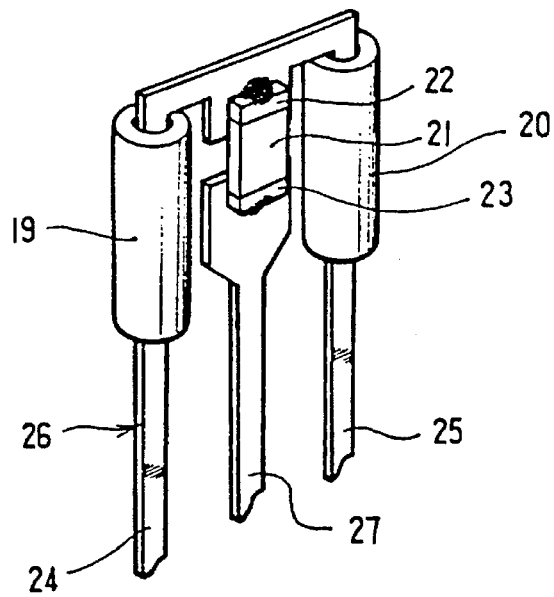
FIG. 3 illustrates the structure of another conventional 3-terminal noise filter.
Figure 4:
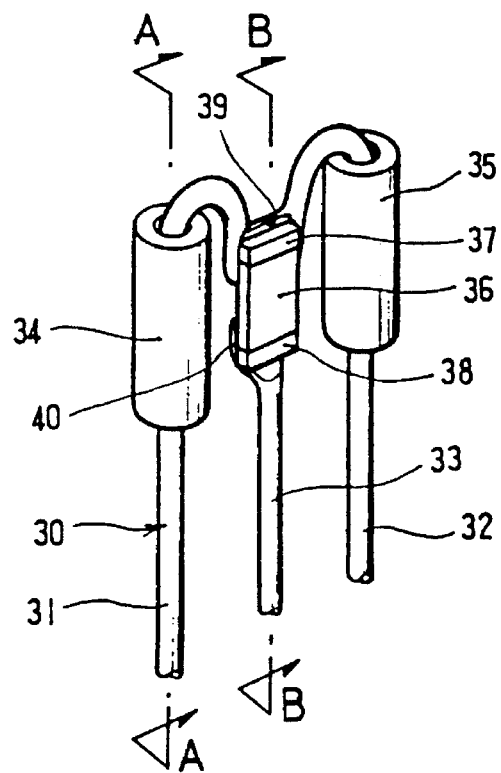
FIG. 4 illustrates the structure of the 3-terminal noise filter according to the present invention.

Reference is now made to the drawings, wherein identical elements are identified by identical numerals throughout the various drawing figures. As shown in FIG. 4, the structure of the 3-terminal noise filter according to the present invention includes:

first and second inductor leads 31 and 32 formed by bending a lead wire 30 into an M shape;

first and second cylindrical ferrite beads 34 and 35 concentrically fitted to the first and second inductor leads 31 and 32;

a first flat portion 39 formed on the bottom of a depressed portion where the first and second leads meet together;

a capacitor lead 33 positioned between the first and second inductor leads 31 and 32, and with a second flat portion 40 being formed thereon; and a chip capacitor 36 with its first and second electrodes 37 and 38 soldered to the first and second flat portions 39 and 40 respectively.

Figure 5:
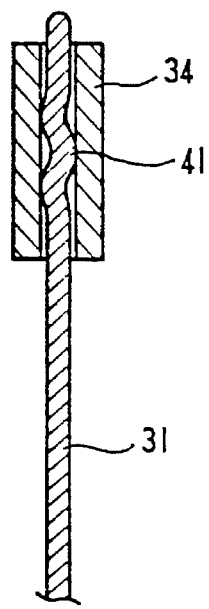
FIG. 5 is a sectional view taken along the line A—A of FIG. 4.
Figure 7A:
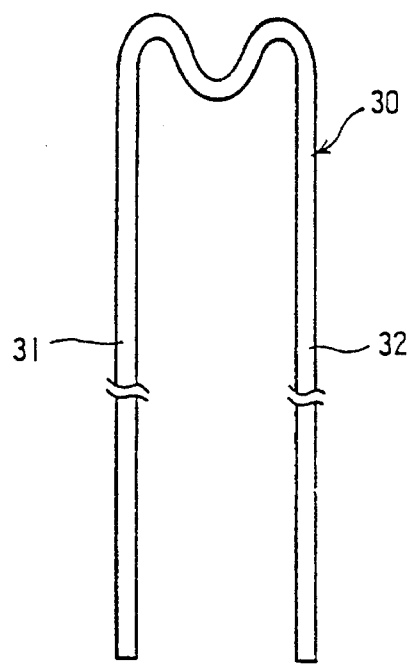
FIGS. 7A, 7B, 7C, 7D and 7E illustrate the respective process steps for manufacturing the 3-terminal noise filter according to the present invention.
Figure 7B:
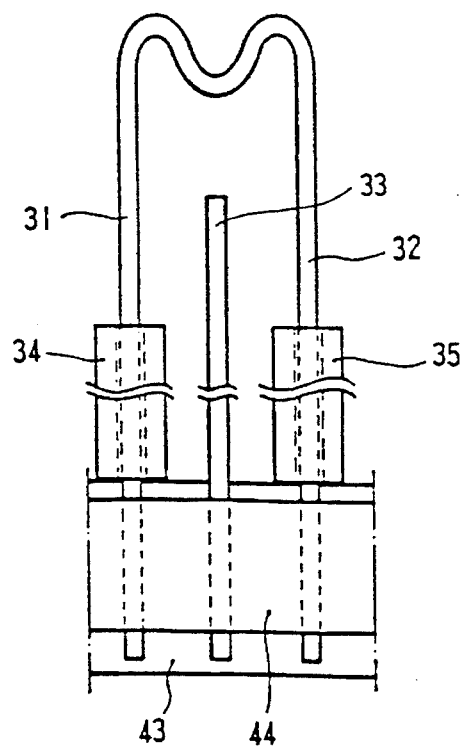
Figure 7C:
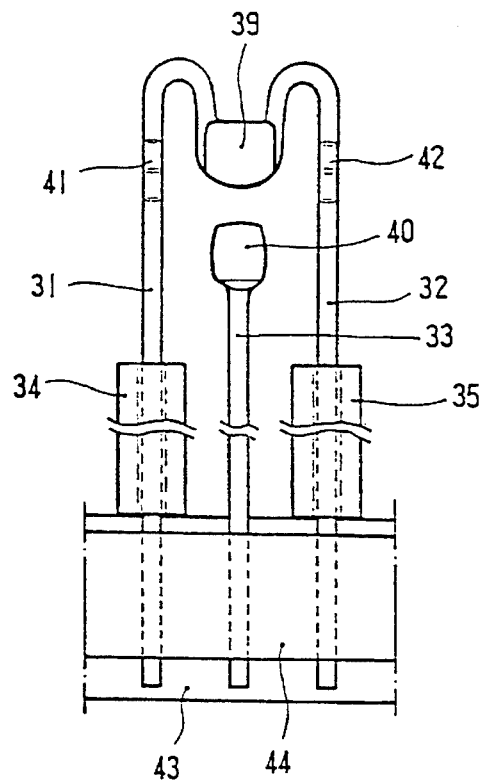

As shown in FIGS. 5 and 7C, irregular portions 41 and 42 can be provided on the first and second inductor leads where the first and second ferrite beads 34 and 35 (see FIG. 7C) are to be fitted.

Figure 6:
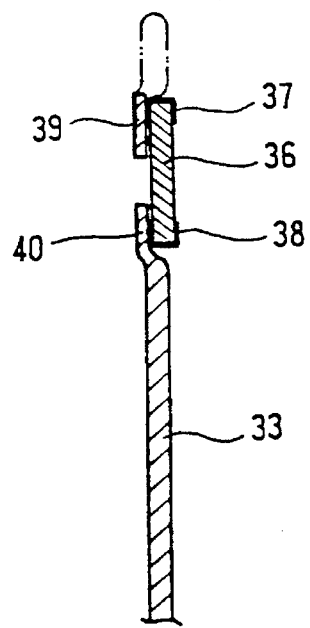
FIG. 6 is a sectional view taken along the line B—B of FIG. 4.

Further, as shown in FIG. 6, there can be formed steps respectively on the first flat portion 39 (formed on the bottom of the depressed portion) and on the second flat portion 40 of the leading end of the capacitor lead 33, in such a manner that the steps should be deviated from the axis of the capacitor lead 33.

Now the 3-terminal noise filter of the present invention constituted as above will be described as to its manufacturing process referring to FIGS. 7A to 7E.

First, a lead wire 30 is bent into an M shaped configuration, in such a manner that a depressed portion in its place formed on the top portion of the structure, and that the first and second inductor leads 31 and 32 should extend on the opposite sides in parallel (FIG. 7A).

Then the first and second inductor leads 31 and 32 are inserted into the first and second cylindrical ferrite beads 34 and 35. Then another lead wire which is to become the capacitor lead 33 is positioned below the bottom of the depressed portion and between the first and second inductor leads 31 and 32 in parallel with them. Then the first and second inductor leads 31 and 32 and the capacitor lead 33 are placed on a base paper 43, and the lower tips of leads 31, 32 and 33 are secured by means of a piece of tape 44 (FIG. 7B).

Then the bottom of the depressed portion and the leading end of the capacitor lead are pressed to form the first and second flat portions 39 and 40. Then irregular portions 41 and 42 are formed on the first and second inductor leads 31 and 32 where the first and second ferrite beads 34 and 35 are to be fitted (FIG. 7C).

The first flat portion 39 is formed with side portions remaining unpressed, so that the first flat portion 39 should have a recessed form.

The second flat portion 40 is formed in such a manner that the lower end of the second flat portion 40 should be made even with the lower ends of the ferrite beads, the upper end of which reach the bent portion of the leads. Meanwhile the upper end of the first flat portion 39 is lower than the upper ends of the ferrite beads.

Then a solder paste is spread on the first and second flat portions 39 and 40, and the first and second electrodes 37 and 38 of the chip capacitor 36 are positioned on the first and second flat portions 39 and 40 to cure them. Then the first and second ferrite beads 34 and 35 are pushed up to the bent portions of the first and second inductor leads 31 and 32, so that the first and second ferrite beads 34 and 35 should be tightly fitted on the irregular portions 41 and 42 (FIG. 7D).

Figure 7D:
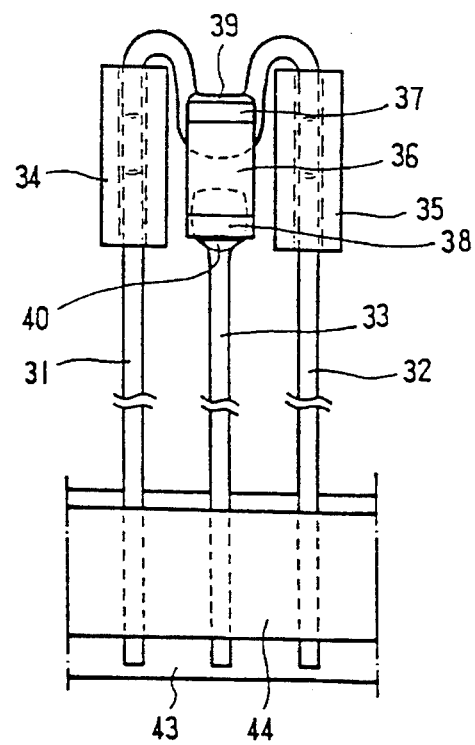
Figure 7E:
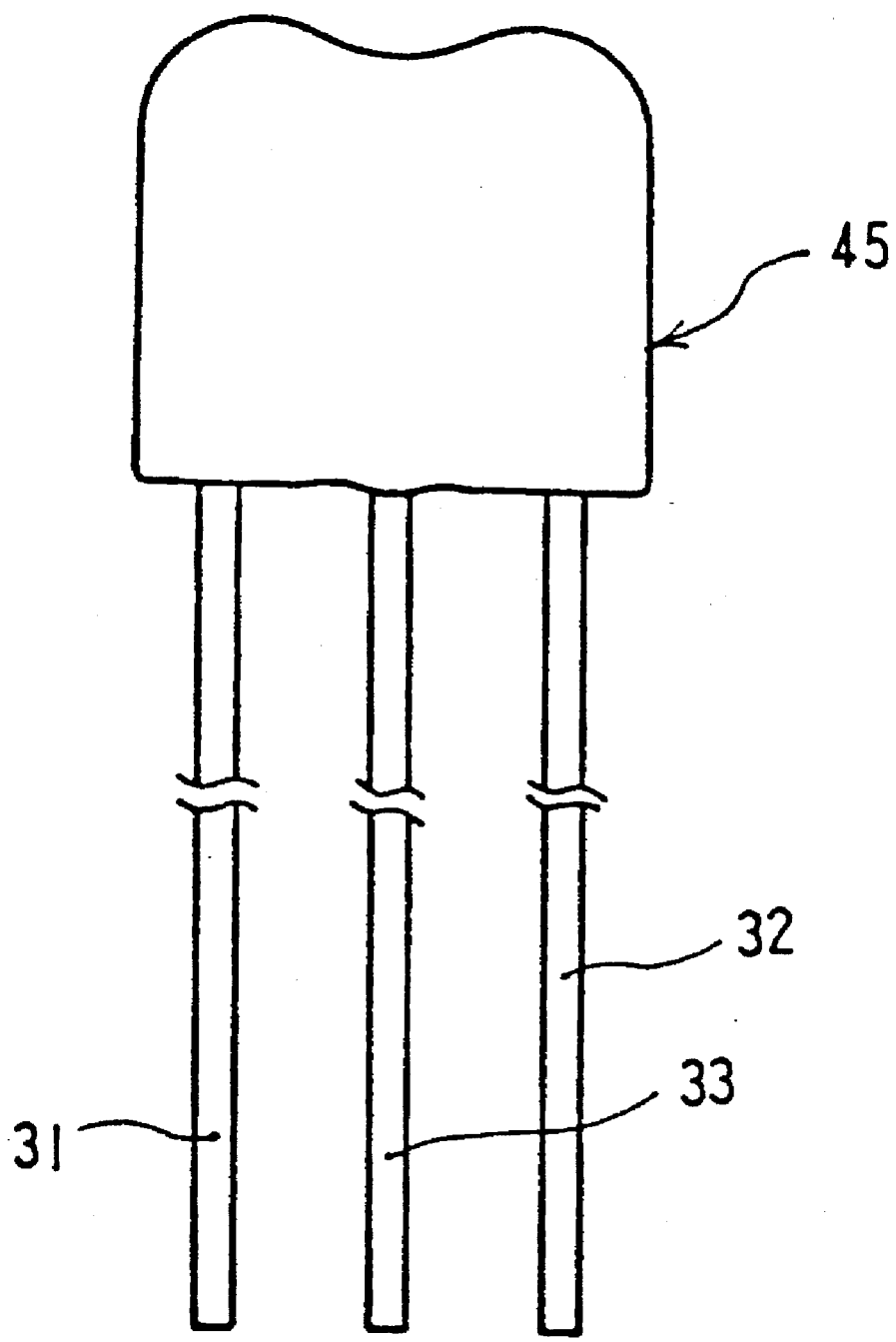

Then a molding with an insulating resin 45 (see FIG. 7E) is carried out to encapsulate the first and second ferrite beads 34 and 35 and the chip capacitor 36 of FIG. 7D, thereby completing the manufacture of the 3-terminal noise filter according to the present invention (FIGS. 7D and 7E).

In the 3-terminal noise filter manufactured according to the present invention as described above, the leading end of the capacitor lead 33 and the bottom of the depressed portion connecting the first and second inductor leads 31 and 32 are pressed to a flat form. Further, the first flat portion 39 is formed in such a manner as to leave an unpressed portion on the left and right sides. Consequently, during the soldering of the chip capacitor, the position of the capacitor can be accurately set, the work efficiency is improved, and the soldering defect rate can be markedly reduced.

Further the first and second flat portions 39 and 40 are provided with steps which are slightly deviated from the axis of the capacitor lead 33. Accordingly, the thickness increase of the noise filter due to the projection of the chip capacitor 36 can be avoided.

Further, the first and second ferrite beads 34 and 35 which are fitted to the first and second inductor leads 31 and 32 are tightly and firmly fixed on the irregular portions 41 and 42. Therefore, during the molding of the insulating resin 45, the burden of the accurate setting of the ferrite beads can be alleviated, so that work efficiency can be improved and the defect level reduced by preventing slippage of the ferrite beads.

Particularly, the present invention uses a low cost lead wire, and therefore, a significant saving in the manufacturing cost can be realized. Further, the lower ends of the 3-terminal noise filter are made even with respect to the two inductor ferrites and the capacitor lead. Therefore, when the noise filter is installed on a circuit board, the parasitic inductance can be removed by the capacitor, thereby improving the performance of the noise filter.

This 3-terminal noise filter is effective in preventing the propagation of noises within an electronic apparatus, or between electronic apparatuses.

What is claimed is:

1. A 3-terminal noise filter comprising:

a single wire having an M shaped structure, said M shaped structure defining first and second inductor lead wires and a depressed portion therebetween;

a capacitor lead wire disposed between said first and second lead wires and in parallel therewith;

first and second flat portions disposed on a bottom of the depressed portion of the M shaped structure and on a leading end of said capacitor lead wire, respectively;

a chip capacitor having first and second electrodes connected to said first and second flat portions, respectively; and first and second ferrite beads concentrically fitted to said first and second inductor lead wires, respectively, wherein said 3-terminal noise filter further includes a respective step disposed on said first and second flat portions, wherein each said step is offset from a longitudinal axis of said capacitor lead wire and wherein said 3-terminal noise filter further includes unpressed portions located on opposed sides of said first flat portion defining a seating area on said first flat portion for said chip capacitor.

2. The 3-terminal noise filter as claimed in claim 1, wherein irregular portions are disposed on said first and second inductor leads for tightly fitting said first and second ferrite beads, respectively.

3. A process for manufacturing a 3-terminal noise filter, comprising the steps of:

forming an upper depressed portion and first and second inductor leads by bending a single lead wire into an M shaped structure;

inserting said first and second inductor leads into first and second ferrite beads, respectively, positioning a capacitor lead between said first and second inductor leads in parallel therewith and securing all of said leads upon a base paper by means of a piece of tape;

pressing a bottom of said depressed portion and a leading end of said capacitor lead into first and second flat portions, respectively;

soldering first and second electrodes of a chip capacitor onto said first and second flat portions, respectively, and pushing said first and second ferrite beads to an upper portion of said first and second inductor leads, respectively; and encapsulating said first and second ferrite beads and said chip capacitor with an insulating resin material.

4. The process for manufacturing a 3-terminal noise filter as claimed in claim 3, wherein, said step of pressing the bottom of said depressed portion and the leading end of said capacitor lead into first and second flat portions, respectively, further includes the step of forming irregular portions on said first and second inductor leads where said first and second ferrite beads are to be respectively fitted.

* * * * *

UNITED STATES PATENT AND TRADEMARK OFFICE
CERTIFICATE OF CORRECTION

PATENT NO.  : 5,493,260
DATED       : February 20, 1996
INVENTOR(S) : Jong M. Park It is certified that error appears in the above-indentified patent and that said Letters Patent is hereby corrected as shown below:

Abstract Line 5 "M shape" should read --M shaped--.

Column 1 Line 34 "The" should read --the--.

Column 2 Line 50 after "means" insert --of--.

Column 3 Line 59 delete "in its place" and insert --is--.

Signed and Sealed this

Eleventh Day of June, 1996

*Attest:*

BRUCE LEHMAN

*Attesting Officer*      Commissioner of Patents and Trademarks